(12) United States Patent
Do et al.

(10) Patent No.: US 6,787,796 B2
(45) Date of Patent: Sep. 7, 2004

(54) ORGANIC ELECTROLUMINESCENT DISPLAY DEVICE AND METHOD OF MANUFACTURING THE SAME

(75) Inventors: Young-rag Do, Suwon (KR); Yoon-chang Kim, Suwon (KR); Jin-woo Park, Yongin (KR); Young-woo Song, Suwon (KR)

(73) Assignee: Samsung SDI Co., Ltd., Suwon-si (KR)

( * ) Notice: Subject to any disclaimer, the term of this patent is extended or adjusted under 35 U.S.C. 154(b) by 1 day.

(21) Appl. No.: 10/266,702

(22) Filed: Oct. 9, 2002

(65) Prior Publication Data

US 2003/0164496 A1 Sep. 4, 2003

(30) Foreign Application Priority Data

Feb. 27, 2002 (KR) ........................................ 2002-10466

(51) Int. Cl.[7] .............................................. H01L 33/00
(52) U.S. Cl. .............................. 257/40; 257/98; 438/29
(58) Field of Search ........................ 257/40, 98; 438/29

(56) References Cited

U.S. PATENT DOCUMENTS

| 6,160,828 | A | * | 12/2000 | Kozlov et al. ................. 372/39 |
| 6,363,096 | B1 | * | 3/2002 | Dodabalapur et al. ........ 372/75 |
| 6,586,268 | B1 | * | 7/2003 | Kopola et al. ................. 438/22 |

FOREIGN PATENT DOCUMENTS

| JP | 62-172691 | 7/1987 |
| JP | 63-314795 | 12/1988 |
| JP | 1-220394 | 9/1989 |
| JP | 11-283751 | 10/1999 |

* cited by examiner

Primary Examiner—Jerome Jackson
(74) Attorney, Agent, or Firm—Staas & Halsey LLP

(57) ABSTRACT

An organic electroluminescent (EL) display device and a method of manufacturing the same. The organic EL device includes a substrate layer, a first electrode layer formed on the substrate layer, an organic layer formed on the first electrode layer, and a second electrode layer formed on the organic layer, wherein a light loss preventing layer having different refractive index areas is formed between layers of the organic EL device having a large difference in refractive index among the respective layers.

50 Claims, 8 Drawing Sheets

ORGANIC ELECTROLUMINESCENT DISPLAY DEVICE AND METHOD OF MANUFACTURING THE SAME

CROSS-REFERENCE TO RELATED APPLICATION

This application claims the benefit of Korean Patent Application No. 2002-10466 filed on Feb. 27, 2002, in the Korean Industrial Property Office, the disclosure of which is incorporated herein by reference.

BACKGROUND OF THE INVENTION

1. Field of the Invention

The present invention relates to an organic electroluminescent (EL) display device, and more particularly, to an organic electroluminescent display device having an improved light extraction efficiency of light generated by an organic layer.

2. Description of the Related Art

Generally, organic electroluminescent display devices are spontaneous emission display devices that emit light by electrically exciting fluorescent organic compounds. The organic electroluminescent display devices are expected to be applied to next generation display devices that can overcome shortcomings of liquid crystal display devices, with characteristics including a low driving voltage, enabling the production of thin and small display panels having a wide viewing angle, and a high response speed.

An organic electroluminescent display device using a layered structure has been developed by the Eastman Kodak Company, and has been commercialized as a green-emitting display device having an improved lifetime by the Pioneer Electronic Corporation. Recently, many kinds of new materials having various molecular structures that are advantageous in organic materials, and organic electroluminescent (EL) display devices for use as color display devices having excellent characteristics including a lower DC drive voltage, small and thin structure, and spontaneous emission, have been the subjects of active research.

An organic electroluminescent (EL) display device includes organic layers having a predetermined pattern on a glass or a transparent insulating substrate, and electrode layers formed on and under the organic layers. The organic layers are made of organic compounds. Usable materials of the organic compounds include copper phthalocyanine (CuPc), N,N-di(naphthalene-1-yl)-N,N'-diphenyl-benzidine (NPD), and tris(8-hydroxyquinoline) aluminium (Alq3).

In the organic EL device having the above-described configuration, if a positive voltage and a negative voltage are applied to the electrodes, holes injected from the electrode to which the positive voltage is applied move to an emitter layer via a hole transport layer, and electrons from a corresponding one of the electrodes are injected into the emitter layer via an electron transport layer. The electrons and holes are recombined at the emitter layer to generate excitons. The generated excitons de-excite from an excited state to a base state so as to have fluorescent molecules of the emitter layer emit light, thereby forming an image.

The light efficiency of the organic EL device driven as described above is divided into an internal efficiency, and an external efficiency or an extraction (taking-out) efficiency. The internal efficiency depends on the photoelectric conversion efficiency of an organic luminescent material. The external efficiency depends on the refractive index of each organic layer constituting the organic EL device. In other words, in the organic EL device, light having an outgoing angle larger than a critical angle cannot be taken out because the light is reflected at an interface between the substrate and the electrode layer, or between the organic layer and the electrode layer.

FIG. 1 shows a conventional organic EL device, where light emitted from an organic layer 10 is transmitted to a transparent glass substrate 11 from an interface between the glass substrate 11 and an indium tin oxide (ITO) electrode 12. The light transmitting efficiency is represented by the following formula:

$$\tfrac{1}{2}(N_{out}/N_{in})^2$$

where N is a refractive index.

Based on the above formula, the light extraction efficiency for each color of the conventional organic EL device is shown in the Table 1 below.

TABLE 1

|  | Blue organic layer | Green organic layer | Red organic layer |
| --- | --- | --- | --- |
| Wavelength (nm) | 450 | 530 | 620 |
| Refractive index of ITO electrode (n) | 2.01 | 1.93 | 1.76 |
| Refractive index of glass substrate | 1.525 | 1.52 | 1.515 |
| Light extraction efficiency | 29% | 34% | 37% |

As shown in the Table 1, as much light as 60% or more becomes extinct in the organic EL device due to a difference in refractive index between the ITO electrode 12 and the glass substrate 11.

An example of an organic EL device which prevents a reduction in light extraction efficiency is disclosed in Japanese Patent Publication No. 63-314795. The organic EL device includes a substrate having an ability to collect light, similarly to a projecting lens. However, the formation of such a projecting lens having the ability to collect light on a substrate is hard to accomplish in a device having a small pixel area, due to luminescence by an organic layer.

On the other hand, Japanese Patent Publication No. 62-172691 discloses an organic EL device comprising a first dielectric layer interposed between a transparent electrode layer and a light-emitting layer, and a second dielectric layer having a refractive index between the refractive index of a substrate glass and a refractive index of the light-emitting layer formed between the transparent electrode and the light-emitting layer.

Furthermore, Japanese Patent Publication No.1-220934 discloses an organic EL device having a lower electrode, an insulation layer, a light-emitting layer and an upper electrode formed on a substrate, and having a mirror which reflects light onto one side surface of the light-emitting layer.

However, since the film thickness of the light-emitting layer of the organic EL device is very small, the formation of a reflection mirror having a tapered surface on the side surface of the organic EL device is difficult using the currently available technique, and a high cost is required to perform the above formation.

The Japanese Patent Publication No. 11-283751 discloses an organic EL device characterized by making a diffraction grating or a zone plate into a component in an organic electroluminescence element which has one or more organic layer between an anode plate and a cathode.

In such an organic EL device, since irregularities must be formed on a surface of a substrate or a fine electrode pattern layer, or a separate diffraction grating must be provided, the fabricating process thereof becomes complex, making it difficult to attain an efficient productivity. Also, formation of an organic layer on the irregularities makes roughness severer due to the irregularities, thereby resulting in deterioration of durability and reliability of the organic EL device.

SUMMARY OF THE INVENTION

Accordingly, it is an object of the present invention to provide an organic EL device which can enhance the luminance of an image by reducing an internal light loss, so as to increase a light-emitting efficiency, and a method of manufacturing the same.

It is another object of the present invention to provide an organic EL device which can reduce a light loss using a light scattering effect at an interface between a layer having a low refractive index and a layer having a high refractive index, and a method of manufacturing the same.

Additional objects and advantages of the invention will be set forth in part in the description which follows and, in part, will be obvious from the description, or may be learned by practice of the invention.

To achieve the above and other objects of the present invention, there is provided an organic EL device comprising a substrate layer, a first electrode layer formed on the substrate layer, an organic layer formed on the first electrode layer, and a second electrode layer formed on the organic layer, and a light loss preventing layer having areas with different refractive indices, formed between ones of the substrate, first electrode, organic, and second electrode layers having a large difference in refractive indices.

The light loss preventing layer may be formed between the substrate layer and the first electrode layer. Adjacent one of the areas having one refractive index may have a pitch in the range of 50 to 3,000 nm, and a thickness of the light loss preventing layer may be in the range of 0.01 to 50 $\mu$m.

In a front-surface emission type organic EL device, the first electrode layer may be made of metal, and the second electrode layer may be made of indium tin oxide (ITO), wherein the light loss preventing layer is formed thereon.

The light loss preventing layer includes inorganic materials having different refractive indices and a difference in refractive indices may be in the range of 0.3 to 3.0. The inorganic materials may be two or more materials selected from the group consisting of $SiO_x$ (x>1), $SiN_x$ (x>1), $Si_3N_4$, $TiO_2$, $MgO$, $ZnO$, $Al_2O_3$, $SnO_2$, $In_2O_3$, $MgF_2$, and $CaF_2$.

To achieve the above and other objects of the present invention, there is also provided an organic EL device comprising a transparent substrate, a first electrode layer formed on the transparent substrate in a first predetermined pattern in a first direction and made of a transparent conductive material, an organic layer formed on the first electrode layer in a second predetermined pattern, a second electrode layer formed on the organic layer in a second direction at a predetermined angle with respect to the first direction, a light loss preventing layer provided between the substrate and the first electrode layer, wherein the light loss preventing layer has areas having different refractive indices, and is formed in a preset pattern, and an encapsulation layer which encapsulates the first electrode layer, the organic layer and the second electrode layer.

To achieve the above and other objects of the present invention, there is further provided an organic EL device comprising a transparent substrate, a pixel area having a transparent first electrode layer formed on the transparent substrate in a first predetermined pattern, an organic layer formed on the first electrode layer in a second predetermined pattern, an insulating layer formed over the transparent substrate which exposes a portion of the organic layer, and a second electrode layer formed on the organic layer and the insulating layer in a third predetermined pattern, a drive area having thin film transistors (TFTs) formed on the transparent substrate, wherein the drive area selectively applies a predetermined voltage to the first electrode layer, and a light loss preventing layer having areas having different refractive indices formed between the transparent substrate and the first electrode layer in a preset pattern.

To achieve the above and other objects of the present invention, there is still further provided an organic EL device having a thin film transistor (TFT), comprising a transparent substrate, a buffer layer formed on the transparent substrate, a thin film transistor (TFT) layer formed on the buffer layer, an insulating layer which covers the TFT layer, a first electrode layer formed on the insulating layer in a first predetermined pattern and to which voltages are selectively applied by the TFT, an insulating planarization layer having an opening which exposes a portion of the first electrode layer, an organic layer formed on the first electrode layer, a second electrode layer formed on the organic layer and the planarization layer in a second predetermined pattern, and a light loss preventing layer having areas having different refractive indices formed between the first electrode layer and the insulating layer, or on the second electrode layer in a preset pattern.

To achieve the above and other objects of the present invention, there is provided a method of manufacturing an organic EL device, the method comprising obtaining layers including a substrate layer, a first electrode layer formed on the substrate layer, an organic layer formed on the first electrode layer, and a second electrode layer formed on the organic layer, and providing a light loss preventing layer having areas with different refractive indices between ones of the substrate, first electrode, organic, and second electrode layers having a large difference in refractive indices, wherein providing of the light loss preventing layer comprises forming a first layer having a first component, masking the first layer using a mask having a predetermined pattern, injecting ions having a second component into the masked first layer, and heat treating the ion-injected layer under an oxidative atmosphere to provide the light loss preventing layer having an ion injected area and a non-ion injected area having different corresponding refractive indices.

To achieve the above and other objects of the present invention, there is provided another method of manufacturing an organic EL device, the method comprising obtaining layers including a substrate layer, a first electrode layer formed on the substrate layer, an organic layer formed on the first electrode layer, and a second electrode layer formed on the organic layer, and providing a light loss preventing layer having areas having different refractive indices, between ones of the substrate, first electrode, organic, and second electrode layers having a large difference in refractive indices, wherein the providing of the light loss preventing layer comprises forming a first layer by coating a composition including a photosensitive material and a binder resin, exposing the coated first layer in a predetermined pattern, and sequentially developing, bleaching and washing the exposed first layer.

BRIEF DESCRIPTION OF THE DRAWINGS

These and other objects and advantages of the present invention will become apparent and more readily appreciated from the following description of the embodiments, taken in conjunction with the accompanying drawings of which.

DETAILED DESCRIPTION OF THE PREFERRED EMBODIMENTS

Figure 1:
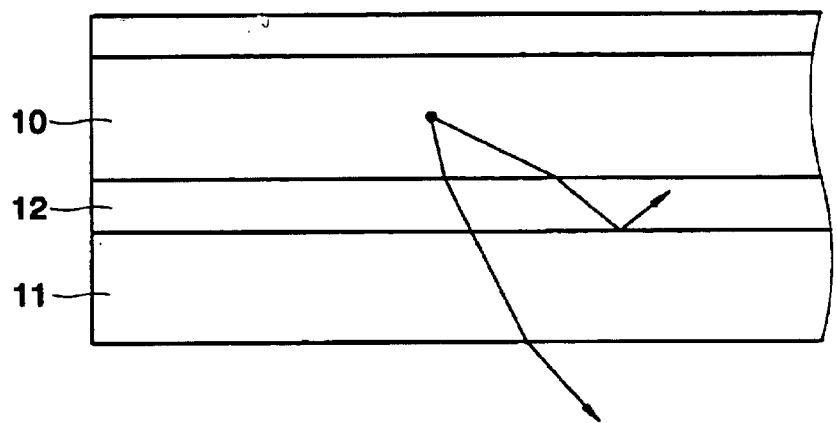
FIG. 1 is a cross-sectional view illustrating the state in which light is taken out from a conventional organic EL device.

Reference will now be made in detail to the embodiments of the present invention, examples of which are illustrated in the accompanying drawings, wherein like reference numerals refer to the like elements throughout. The embodiments are described below in order to explain the present invention by referring to the figures.

Figure 2:
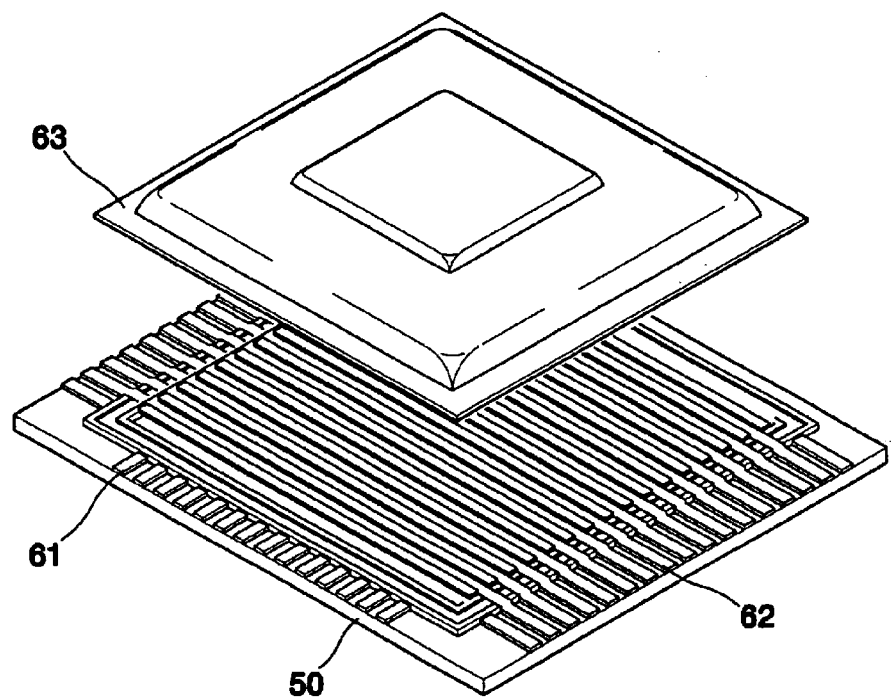
FIG. 2 is a perspective view of an organic EL device according to an embodiment of the present invention.
Figure 3:
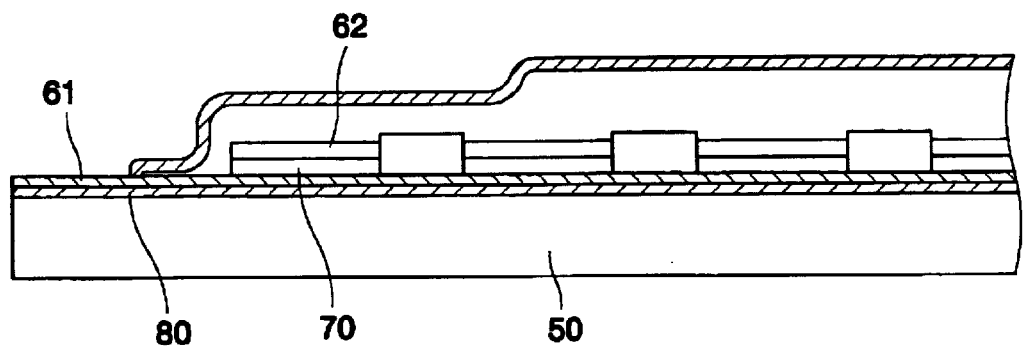
FIG. 3 is a cross-section view of the organic EL device shown in FIG. 2.
Figure 4:
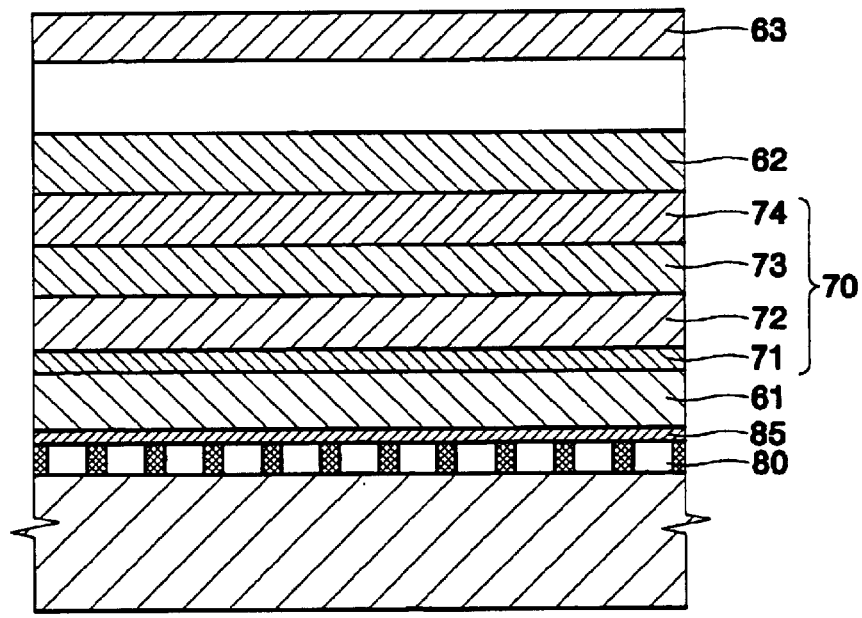
FIG. 4 is a partly extracted, enlarged cross-sectional view of the organic EL device shown in FIG. 2.

FIGS. 2, 3 and 4 show, for example, a passive matrix organic light emitting display (PMOLED) device according to an embodiment of the present invention.

Referring to the drawings, the PMOLED device includes a first electrode layer 61 having a predetermined pattern formed on a transparent substrate 50, an organic layer 70 having a plurality of organic films laminated on the first electrode layer 61, a second electrode layer 62 having a predetermined pattern formed on the organic layer 70, and a light loss preventing layer 80 installed between the substrate 50 and the first electrode layer 61. In the shown embodiment, the layers 50 and 61 have a large difference in refractive indices. The light loss preventing layer 80 includes areas having different refractive indices coexisting in a predetermined pattern. The PMOLED further includes a cap plate 63 installed on the substrate 50 so as to encapsulate the first electrode layer 61, the organic layer 70 and the second electrode layer 62. While shown as between the layers 50 and 61, it is understood that the light loss preventing layer 80 can be between other layers having a large difference in refractive indices.

A planarization layer 85 which planarizes the light loss preventing layer 80 may be further provided on the light loss preventing layer 80.

The first electrode layer 61 is an anode formed on the transparent substrate 50 and is made of, for example, indium tin oxide (ITO), which is a transparent conductive material. As shown in FIG. 2, the first electrode layer 61 comprises, for example, striped electrodes installed in parallel with one another.

As shown in FIG. 4, the organic layer 70 includes a hole injection layer 71, a hole transport layer 72, an emitter layer 73, and an electron transport layer 74 sequentially stacked from a top surface of the first electrode layer 61. The organic layer 70 is preferably made of organic compounds represented by small-molecule materials such as tris(8-hydroxyquinoline) aluminium ($Alq_3$), and polymers such as poly(para-phenylenevinylenes) or poly(2-methoxy-5(2'-ethylhexyloxy)-1,4-phenylenevinylenes.

The second electrode layer 62 is formed of a conductive metal. As shown in FIG. 2, the second electrode layer 62 comprises, for example, striped electrodes formed in a direction orthogonal with respect to a direction of the first electrode layer 61.

The light loss preventing layer 80 is installed between ones of the layers 62, 70, 61, and 50 having a large difference in refractive indices among components of an organic EL device, i.e., a substrate 50, a first electrode 61, an organic EL unit 70 and a second electrode 62. In the shown embodiment, the light loss preventing layer 80 is formed between the substrate 50, in which light loss is large, and the first electrode layer 61 made of ITO.

Figure 5A:
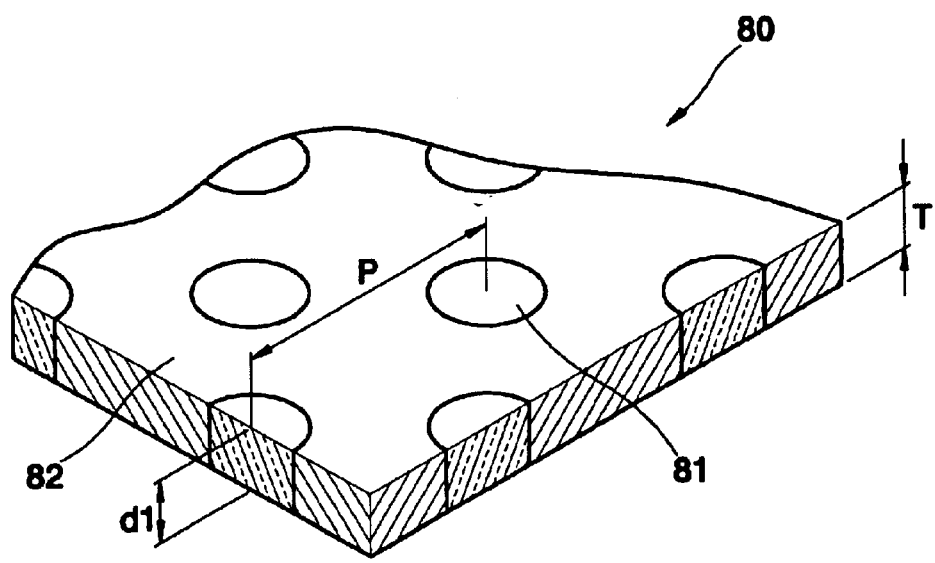
FIGS. 5A and 5B are partly extracted, enlarged cross-sectional views of anti-reflection layers of the present invention, for use in an organic EL device.
Figure 5B:
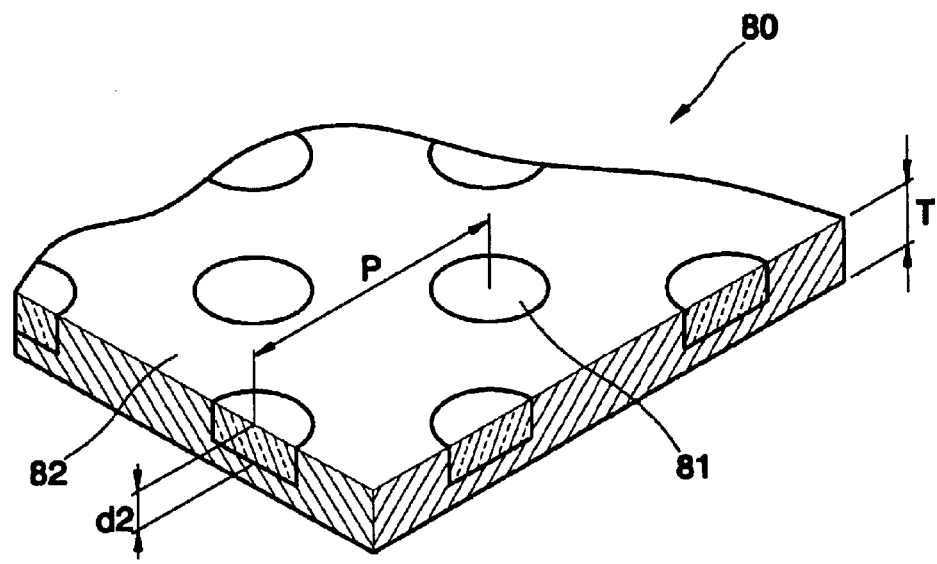

FIG. 5A shows the light loss preventing layer 80 which includes a first area 81 and a second area 82 having different refractive indices. While the first area 81 has a dot-shaped feature, it is understood that the shape is not limited thereto. In the embodiment of FIG. 5A, a depth (d1) of the first area 81 having a dot-shaped feature is equal to a thickness (T) of the second area 82. FIG. 5B shows another light loss preventing layer 80 which includes a first area 81 and a second area 82 having different refractive indices. In the embodiment of FIG. 5B, a depth (d2) of the first area 81 is less than a thickness (T) of the second area 82. Here, a difference in refractive indices between materials for the first and second areas 81 and 82 is, for example, from 0.3 to 3, and a large difference is generally desired. Where the difference is less than 0.3, the light scattering efficiency at the interface between the two areas is reduced to increase reflectivity of light irradiated from the organic layer 70. Accordingly, the light transmitted through the substrate 50 is decreased. A thickness (T) of the light loss preventing layer 80 is, for example, 0.03 to 50 $\mu$m. Here, in consideration of the reflectivity, a pitch (P) of the first area 81 is, for example, 50 to 3,000 nm, which is adjustable according to a wavelength of light generated from the organic layer 70.

The light loss preventing layer 80 has a transmissivity of, for example, 80% or more so as to reduce the loss of light generated from the organic layer 70.

Materials of the light loss preventing layer 80 include inorganic materials or polymers. The inorganic materials may be at least one selected from the group consisting of $SiO_x$ (x>1), $SiN_x$ (x>1), $Si_3N_4$, $TiO_2$, MgO, ZnO, $Al_2O_3$, $SnO_2$, $In_2O_3$, $MgF_2$, and $CaF_2$. The light loss preventing layer 80 may comprise, for example, a $SiO_x$ (x>1) coating having a refractive index of 1.6 doped with $TiO_2$ having a refractive index of 2.5 to 3.

The light loss preventing layer 80 may be formed by removing a photosensitive material from the resultant product of coating and exposure performed on a composition comprising the photosensitive material and a binder resin. The photosensitive material is, for example, formed of one selected from silver halides, and the binder resin is formed of, for example, gelatin.

Referring back to FIG. 4, the planarization layer 85 formed on the light loss preventing layer 80 is made of a transparent material and planarizes a top surface of the light loss preventing layer 80 to prevent deformation of the first electrode layer 61 while forming the first electrode layer 61 over the light loss preventing layer 80.

Figure 6:
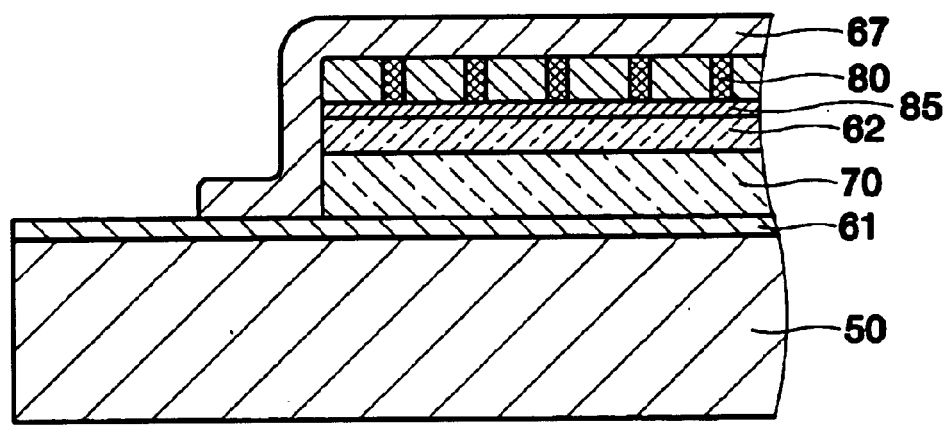
FIG. 6 is a cross-sectional view of an organic EL device according to another embodiment of the present invention.

FIG. 6 shows a cross-sectional view of an organic EL device according to another embodiment of the present invention. The organic EL device includes a substrate 50, a first electrode layer 61 having a predetermined pattern and made of a metal on the substrate 50, an organic layer 70 formed on the first electrode layer 61, a second electrode layer 62 formed at a predetermined angle with respect to the first electrode layer 61 on the organic layer 70 and made of a transparent conductive material, and a light loss preventing layer 80 which includes areas having different refractive indices coexisting on the second electrode layer 62. The organic EL device also includes a transparent encapsulation layer 67 which encapsulates the first and second electrode layers 61 and 62, exclusive of terminal portions thereof, the organic layer 70 and the light loss preventing layer 80. The light loss preventing layer 80 has the same configuration as described above with reference to FIG. 5A or FIG. 5B, and an explanation thereof will not be repeated. A planarization layer 85 may be further provided between the light loss preventing layer 80 and the second electrode layer 62.

Figure 7:
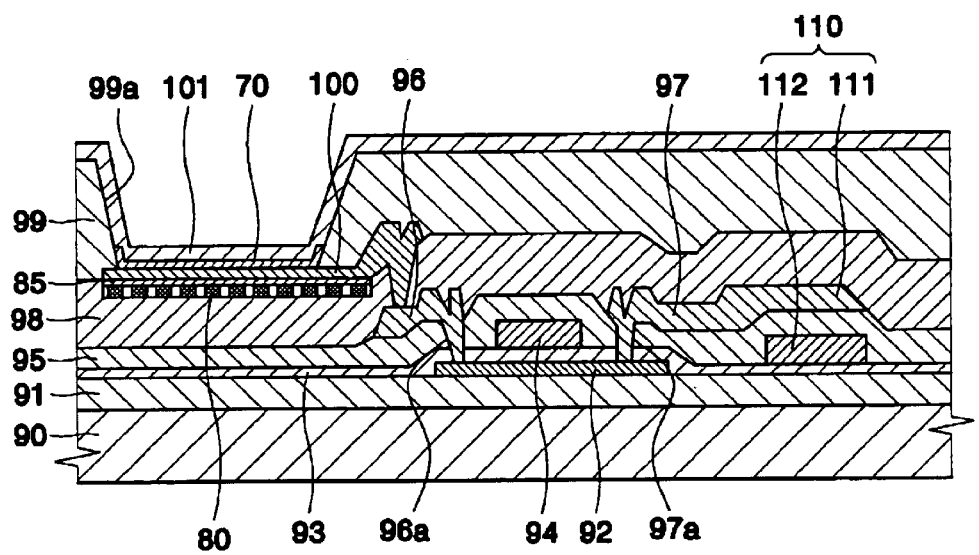
FIG. 7 is a cross-sectional view of an organic EL device according to still another embodiment of the present invention.

FIG. 7 shows an active matrix organic light emitting display (AMOLED) device as an organic EL device according to still another embodiment of the present invention.

The AMOLED device includes a buffer layer 91 formed on a transparent substrate 90, a pixel area (described herein below) having pixels and a transparent electrode for a pixel formation, formed on the buffer layer 91, and a drive area (described herein below) having a thin film transistor (TFT) and a capacitor 110.

In the drive area, the TFT includes a p-or n-type semiconductor layer 92 arranged on the buffer layer 91 in a predetermined pattern, and covered by a gate insulation layer 93, a gate electrode layer 94 corresponding to the semiconductor layer 92, and a first insulation layer 95 which covers the gate electrode layer 94. The gate electrode layer 94 and the first insulation layer 95 are formed on the gate insulation layer 93, and drain and source electrodes 96 and 97 are connected to both sides of the semiconductor layer 92 via contact holes 96a and 97a formed through the first insulation layer 95 and the gate insulation layer 93, and are formed on the first insulation layer 95. The capacitor 110 includes a first auxiliary electrode 111 connected with the source electrode 97 and formed on the first insulation layer 95, and a second auxiliary electrode 112 opposed to the first auxiliary electrode 111 and covered by the first insulation layer 95.

A second insulation layer 98 is formed on the first insulation layer 95, and a planarization layer 99 having an opening 99a is formed in the pixel area. A first electrode layer 100 is electrically connected to the drain electrode 96 and is formed on a bottom of the opening 99a of the planarization layer 99. An organic layer 70 is formed on the first electrode layer 100, and a second electrode layer 101 is formed on the organic layer 70 and planarization layer 99.

In a rear-surface emission type organic EL device, in which the first electrode layer 100 is made of ITO, which is a transparent conductive material, the substrate 90, the buffer layer 91, the gate insulation layer 93 and the first and second insulation layers 95 and 98 are made of transparent materials. A light loss preventing layer 80 may be formed between the transparent electrode 100 and the second insulation layer 98 in a predetermined pattern. A planarization layer 85 which planarizes the light loss preventing layer 80 may be further provided between the light loss preventing layer 80 and the transparent electrode 100.

The light loss preventing layer 80 has the same configuration as described above.

Figure 8:
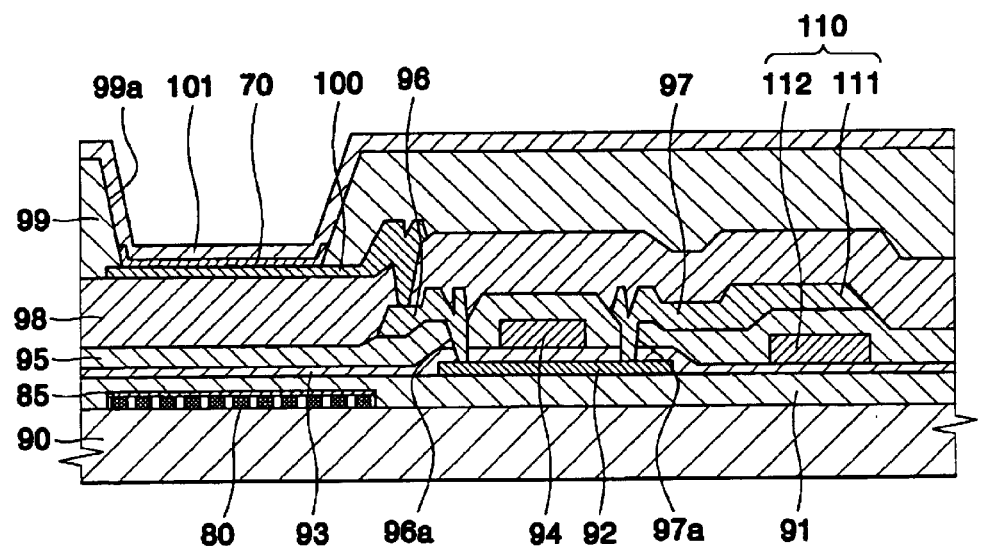
FIGS. 8 and 9 are cross-sectional views of organic EL devices according to yet two additional embodiments of the present invention.
Figure 9:
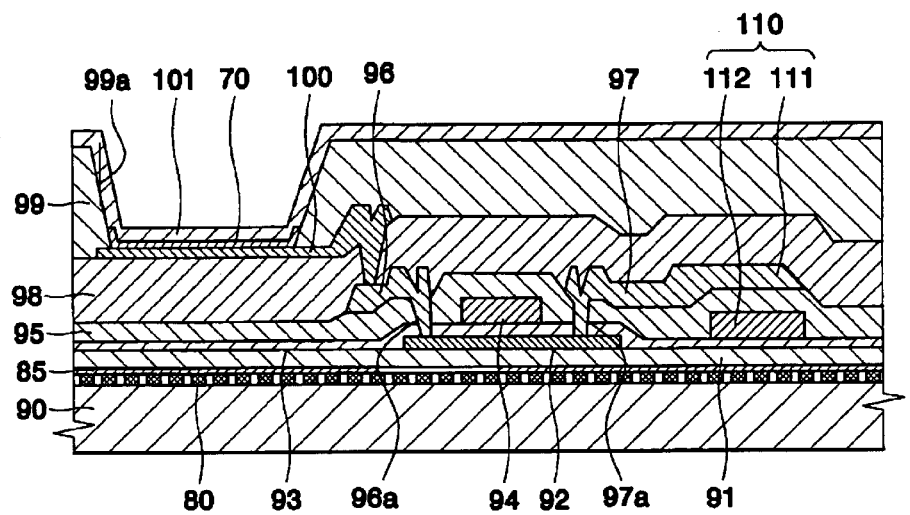

It is understood that a location where the light loss preventing layer 80 is installed is not limited to the embodiment shown in FIG. 7. That is, the light loss preventing layer 80 may be installed between other layers having a large difference in refractive indices, for example, between the substrate 90 and the buffer layer 91, as shown in FIGS. 8 and 9. The planarization layer 85 may also be provided on top of the light loss preventing layer 80, as shown in FIGS. 8 and 9.

Figure 10:
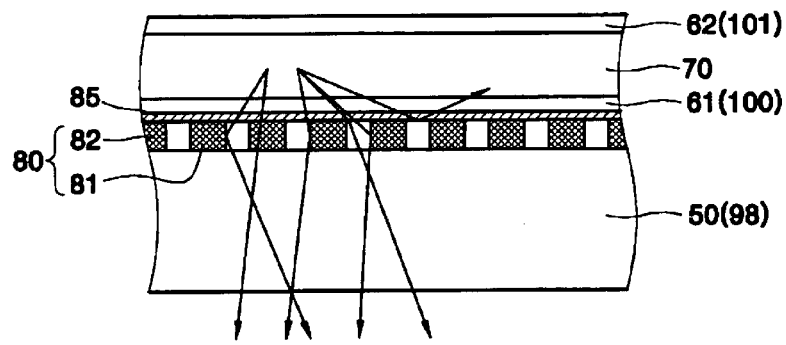
FIG. 10 is a cross-sectional view illustrating the state in which light is taken out from an organic EL device according to the present invention.

FIG. 10 shows a state in which light is taken out from an organic EL device according to the present invention.

An operation of an organic EL device according to the present invention will be described with reference to FIGS. 2 to 10. Where a predetermined voltage is applied to one selected from the first electrode layer 61 and the second electrode layer 62 in the organic EL device shown in FIGS. 2 and 3, or where a predetermined voltage is applied to the first electrode layer 100 and the second auxiliary electrode 111 by a selected TFT in the organic EL device shown in FIG. 7, holes injected from the first electrode layer 61 (i.e., the anode) move to the emitter layer 73 via the hole transport layer 72, and electrons from the second electrode layer 62 are injected into the emitter layer 73 via the electron transport layer 74. The electrons and holes are recombined at the emitter layer 73 to generate excitons, and the generated excitons de-excite from an excited state to a base state so as to have fluorescent molecules of the emitter layer 73 emit light, thereby forming an image.

The emitted light is taken out via the transparent first electrode layer 61, the light loss preventing layer 80 and the substrate 50 (FIG. 3), or via the first electrode layer 100, the light loss preventing layer 80, the first and second insulation layers 95 and 98, the buffer layer 91 and the substrate 90 (FIG. 7). Since the light loss preventing layer 80 is formed between layers having a large difference in refractive indices (i.e., between the first layer 61 and the substrate 50 (FIG. 3) or between the first electrode layer 100 and the second insulation layer 98 (FIG. 7)), light can be prevented from being reflected at the interface therebetween, thus preventing loss.

In other words, since a refractive index of the organic layer 70 including a light-emitting layer 73 or the first electrode layer 61 is relatively higher than a refractive index of the substrate 50 made of, for example, glass (or the second insulation layer 98 shown in FIG. 7), light is reflected at the interface between the substrate 50 and the organic layer 70 or the first electrode layer 61. However, since the light loss preventing layer 80 having the first and second areas 81 and 82 with different refractive indices exists between the substrate 50 and the first electrode layer 61, light is scattered due to a difference in refractive index between the first and second areas 81 and 82, thereby preventing the light from being reflected at the interface between the substrate 50 and the first electrode layer 61. In particular, in the first and second areas 81 and 82, the light irradiated from a light-emitting layer to an interface at an outgoing angle larger than a critical angle is scattered at an angle smaller than the critical angle, thereby greatly reducing a reflectivity at the interface. Also, since materials having different refractive indices are alternately provided in the light loss preventing layer 80, an average refractive index of the light loss preventing layer 80 can be adjusted so as to increase an angle of total reflection to provide an anti-reflection effect, thereby greatly increasing a light extraction efficiency. Therefore, the efficiency of taking out the light generated from an organic layer through a substrate can be increased.

Figure 11:
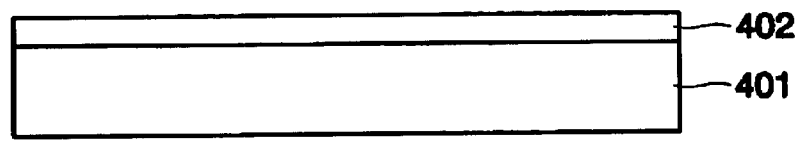
FIGS. 11 through 16 are schematic diagrams illustrating methods of forming an anti-reflection layer of an organic EL device according to embodiments of the present invention.
Figure 12:
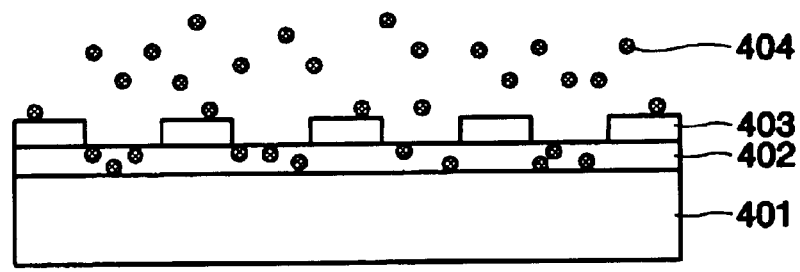
Figure 13:
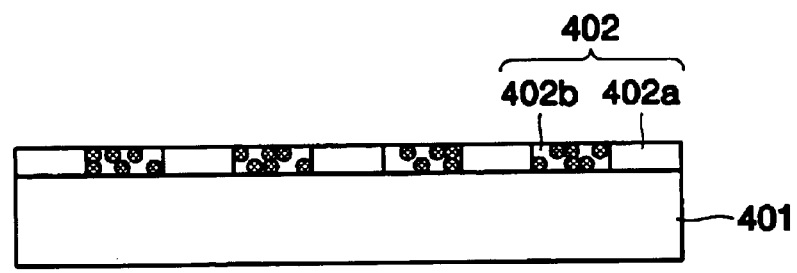

FIGS. 11 through 13 are schematic diagrams illustrating a method of forming an anti-reflection layer (i.e., a light loss preventing layer 80) of an organic EL device according to an embodiment of the present invention. Although it has been described that an anti-reflection layer is formed on a substrate 401, it is understood that the invention is not limited thereto and various modifications can be made.

To form the light loss preventing layer on a substrate 401, a first layer 402 having a first component is formed on the substrate 401 to a thickness of, for example, 5000 Å, and the first layer 402 is masked using a mask 403 having a predetermined pattern. For example, the mask 403 is formed by forming a chrome mask layer having a thickness of, for example, 500 Å on the first layer 402 and forming a predetermined pattern having a through area formed at an interval of, for example, 400 to 600 µm through a photolithography process.

Next, ions having a second component are injected into the masked first layer 402. The first component of the first layer 402 and the second component of the injected ions are made of an inorganic material selected from the group consisting of $SiO_x$ (x>1), $SiN_x$ (x>1), $Si_3N_4$, $TiO_2$, MgO, ZnO, $Al_2O_3$, $SnO_2$, $In_2O_3$, $MgF_2$, and $CaF_2$, respectively. For example, the first component may be made of $SiO_x$ (x>1), and the second component may be made of $TiO_2$.

After the injection of the ions, the chrome mask layer is removed using a wet etching process. Then, the first layer 402 having an ion injected area 402b and a non-ion injected area 402a is subjected to a heat treatment under an oxidative atmosphere, thereby completing the formation of a light loss preventing layer 402.

Figure 14:
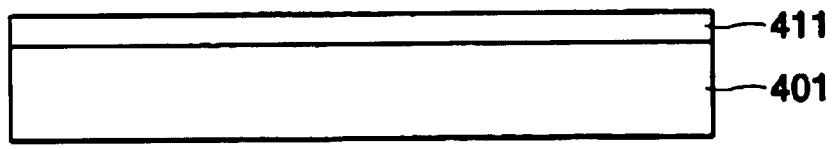
Figure 15:
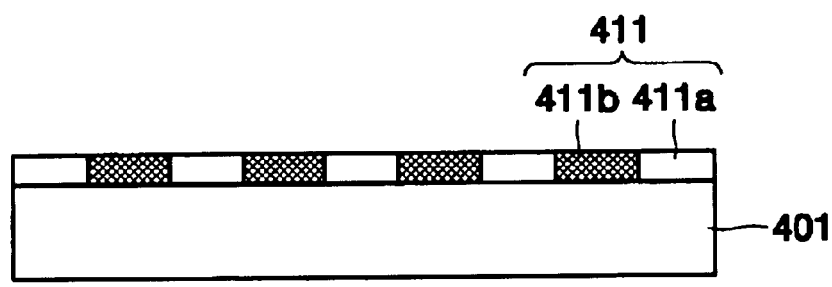
Figure 16:
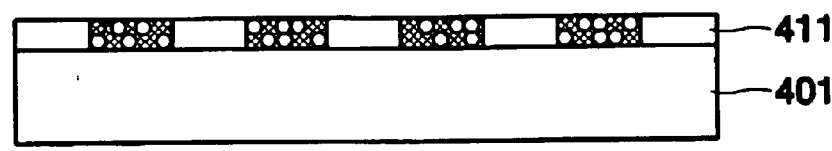

FIGS. 14 through 16 show schematic diagrams illustrating a method of forming a light loss preventing layer as an anti-reflection layer of an organic EL device according to another aspect of the present invention.

To form a light loss preventing layer, a first layer 411 is formed on a substrate 401 by coating a composition including a photosensitive material and a binder resin to a thickness of, for example, 10 µm. The photosensitive material is made of one selected from silver halides, and the binder resin is made of gelatin.

The resulting first layer 411 is exposed in a predetermined pattern having a pitch of, for example, 50 to 3,000 µm, e.g., dots, lattice or polygon. The exposure may be performed using an argon laser. The exposed first layer 411 is sequentially developed, bleached and washed. Accordingly, as shown in FIG. 15, areas 411a and 411b having different refractive indices may be formed.

As described above, in an organic EL device of the present invention, an internal loss of light can be reduced, and light extraction efficiency can be increased by forming a light loss preventing layer between layers having a large difference in refractive indices. According to the experiments carried out by the present inventors, by forming a light loss preventing layer, a light extraction efficiency is increased by approximately 2 times in a case of an ion injection, and 1.5 to 2.5 times in a case of coating a composition including a photosensitive material and a binder resin, as compared to that of a conventional organic EL device. Additionally, since an external efficiency of light is increased by improved extraction efficiency, the lifetime of the present organic EL device is enhanced by approximately 1.5 to 2 times that of the conventional organic EL device.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. An organic electroluminescent (EL) display device comprising:
   a substrate layer;
   a first electrode layer formed on the substrate layer;
   an organic layer formed on the first electrode layer;
   a second electrode layer formed on the organic layer; and
   a light loss preventing layer having areas with different refractive indices, formed between ones of the substrate, first electrode, organic, and second electrode layers having a large difference in refractive indices.

2. The organic EL device according to claim 1, wherein the light loss preventing layer is formed between the substrate layer and the first electrode layer.

3. The organic EL device according to claim 1, further comprising a planarization layer formed on the light loss preventing layer.

4. The organic EL device according to claim 1, wherein adjacent one of the areas having one refractive index has a pitch in the range of 50 to 3,000 nm.

5. The organic EL device according to claim 3, wherein the light loss preventing layer has a thickness in the range of 0.01 to 50 µm.

6. The organic EL device according to claim 2, wherein the first electrode is made of indium tin oxide (ITO).

7. The organic EL device according to claim 1, wherein the second electrode layer is made of ITO and the light loss preventing layer is formed thereon.

8. The organic EL device according to claim 1, wherein the light loss preventing layer comprises inorganic materials having different refractive indices and a difference in refractive indices is in the range of 0.3 to 3.0.

9. The organic EL device according to claim 8, wherein the inorganic materials comprises two or more materials selected from the group consisting of $SiO_x$(x>1), $SiN_x$(x>1), $Si_3N_4$, $TiO_2$, MgO, ZnO, $Al_2O_3$, $SnO_2$, $In_2O_3$, $MgF_2$, and $CaF_2$.

10. The organic EL device according to claim 8, wherein the light loss preventing layer has a light transmissivity of 80% or more.

11. The organic EL device according to claim 1, wherein the light loss preventing layer includes polymers having different refractive indices and a difference in refractive indices is 0.3 or more.

12. The organic EL device according to claim 11, wherein the light loss preventing layer is a composition comprising a photosensitive material and a binder resin.

13. The organic EL device according to claim 12, wherein the photosensitive material is one selected from silver halides.

14. The organic EL device according to claim 12, wherein the binder resin is made of gelatin.

15. The organic EL device according to claim 1, wherein the light loss preventing layer comprises areas of $SiO_x(x>1)$ and areas of $TiO_2$.

16. An organic EL device comprising:
  a transparent substrate;
  a first electrode layer formed on the transparent substrate in a first predetermined pattern in a first direction, and made of a transparent conductive material;
  an organic layer formed on the first electrode layer in a second predetermined pattern;
  a second electrode layer formed on the organic layer in a second direction at a predetermined angle with respect to the first direction;
  a light loss preventing layer provided between the substrate and the first electrode layer, wherein the light loss preventing layer has areas having different refractive indices, and is formed in a preset pattern; and
  an encapsulation layer which encapsulates the first electrode layer, the organic layer and the second electrode layer.

17. The organic EL device according to claim 16, wherein adjacent one of the areas having one refractive index has a pitch in the range of 50 to 3,000 nm.

18. The organic EL device according to claim 16, wherein the light loss preventing layer has a thickness in the range of 0.01 to 50 $\mu$m.

19. The organic EL device according to claim 16, wherein the light loss preventing layer includes inorganic materials having different refractive indices and a difference in refractive indices is 0.3 or more.

20. The organic EL device according to claim 16, wherein the inorganic materials comprises two or more materials selected from the group consisting of $SiO_x(x>1)$, $SiN_x(x>1)$, $Si_3N_4$, $TiO_2$, $MgO$, $ZnO$, $Al_2O_3$, $In_2O_3$, $SnO_2$, $MgF_2$, and $CaF_2$.

21. The organic EL device according to claim 16, wherein the light loss preventing layer is a composition comprising a photosensitive material and a binder resin.

22. The organic EL device according to claim 21, wherein the photosensitive material is one selected from silver halides.

23. The organic EL device according to claim 21, wherein the binder resin is made of gelatin.

24. The organic EL device according to claim 20, wherein the light loss preventing layer comprises areas of $SiO_x(x>1)$ and areas of $TiO_2$.

25. The organic EL device according to claim 16, further comprising a planarization layer formed on the light loss preventing layer.

26. An organic EL device comprising:
  a transparent substrate;
  a pixel area having a transparent first electrode layer formed on the transparent substrate in a first predetermined pattern, an organic layer formed on the first electrode layer in a second predetermined pattern, an insulating layer formed over the transparent substrate which exposes a portion of the organic layer, and a second electrode layer formed on the organic layer and the insulating layer in a third predetermined pattern;
  a drive area having thin film transistors (TFTs) formed on the transparent substrate, wherein the drive area selectively applies a predetermined voltage to the first electrode layer; and
  a light loss preventing layer having areas having different refractive indices formed between the transparent substrate and the first electrode layer in a preset pattern.

27. The organic EL device according to claim 26, wherein adjacent one of the areas having one refractive index has a pitch in the range of 50 to 3,000 nm.

28. The organic EL device according to claim 27, wherein the light loss preventing layer has a thickness in the range of 0.01 to 50 $\mu$m.

29. The organic EL device according to claim 26, wherein the light loss preventing layer includes inorganic materials having different refractive indices and a difference in refractive indices is 0.3 or more.

30. The organic EL device according to claim 26, wherein the inorganic materials comprises two or more materials selected from the group consisting of $SiO_x(x>1)$, $SiN_x(x>1)$, $Si_3N_4$, $TiO_2$, $MgO$, $ZnO$, $Al_2O_3$, $SnO_2$, $In_2O_3$, $MgF_2$, and $CaF_2$.

31. The organic EL device according to claim 26, wherein the light loss preventing layer is a composition comprising a photosensitive material and a binder resin.

32. The organic EL device according to claim 26, further comprising a planarization layer formed on the light loss preventing layer.

33. An organic EL device having a thin film transistor (TFT), comprising:
  a transparent substrate;
  a buffer layer formed on the transparent substrate;
  a thin film transistor (TFT) layer formed on the buffer layer;
  an insulating layer which covers the TFT layer;
  a first electrode layer formed on the insulating layer in a first predetermined pattern and to which voltages are selectively applied by the TFT;
  an insulating planarization layer having an opening which exposes a portion of the first electrode layer;
  an organic layer formed on the first electrode layer;
  a second electrode layer formed on the organic layer and the planarization layer in a second predetermined pattern; and
  a light loss preventing layer having areas having different refractive indices formed between the first electrode layer and the insulating layer, or on the second electrode layer in a preset pattern.

34. The organic EL device according to claim 33, wherein the light loss preventing layer includes two or more materials selected from the group consisting of $SiO_x$ (x>1), $SiN_x(x>1)$, $Si_3N_4$, $TiO_2$, $MgO$, $ZnO$, $Al_2O_3$, $SnO_2$, $In_2O_3$, $MgF_2$, and $CaF_2$.

35. The organic EL device according to claim 33, wherein the light loss preventing layer comprises areas of $SiO_x(x>1)$ and areas $TiO_2$.

36. A method of manufacturing an organic EL device, the method comprising:
obtaining layers including a substrate layer, a first electrode layer formed on the substrate layer, an organic layer formed on the first electrode layer, and a second electrode layer formed on the organic layer; and
providing a light loss preventing layer having areas with different refractive indices between ones of the substrate, first electrode, organic, and second electrode layers having a large difference in refractive indices, wherein the providing of the light toss preventing layer comprises:
forming a first layer having a first component,
masking the first layer using a mask having a predetermined pattern,
injecting ions having a second component into the masked first layer, and
heat treating the ion-injected layer under an oxidative atmosphere to provide the light loss preventing layer having an ion injected area and a non-ion injected area having different corresponding refractive indices.

37. The method according to claim 36, wherein the first component and the second component include an inorganic material selected from the group consisting of $SiO_x(x>1)$, $SiN_x(x>1)$, $Si_3N_4$, $TiO_2$, $MgO$, $ZnO$, $Al_2O_3$, $SnO_2$, $In_2O_3$, $MgF_2$, and $CaF_2$.

38. The method according to claim 36, wherein the first component includes $SiO_x(x>1)$ and the second component includes $TiO_2$.

39. A method of manufacturing an organic EL device, the method comprising:
obtaining layers including a substrate layer, a first electrode layer formed on the substrate layer, an organic layer formed on the first electrode layer, and a second electrode layer formed on the organic layer; and
providing a light loss preventing layer having areas having different refractive indices, wherein the providing of the light loss preventing layer comprises:
forming a first layer by coating a composition including a photosensitive material and a binder resin,
exposing the coated first layer in a predetermined pattern, and
sequentially developing, bleaching and washing the exposed first layer.

40. The method according to claim 39, wherein the photosensitive material is one selected from silver halides.

41. The method according to claim 39, wherein the binder resin is made of gelatin.

42. The organic EL device according to claim 2, wherein adjacent one of the areas having one refractive index has a pitch in the range of 50 to 3,000 nm.

43. The organic EL device according to claim 42, wherein the light loss preventing layer has a thickness in the range of 0.01 to 50 μm.

44. The organic EL device according to claim 9, wherein the light loss preventing layer has a light transmissivity of 80% or more.

45. The organic EL device according to claim 9, wherein the light loss preventing layer comprises areas of $SiO_x(x>1)$ and areas of $TiO_2$.

46. The organic EL device according to claim 34, wherein the light loss preventing layer comprises areas of $SiO_x(x>1)$ and areas of $TiO_2$.

47. An organic EL display device comprising: layers which include a substrate layer, a first electrode layer, an organic layer which emits light, and a second electrode layer; and a light loss preventing layer including areas having different refractive indices which selectively scatters and reflects the light, formed between ones of the layers, which include the substrate, first electrode, organic, and second electrode layers, having a large difference in refractive indices so as to prevent reflection at an interface of the layers.

48. The organic EL device according to claim 47, wherein ones areas of a first refractive index are alternately provided with areas of a second refractive index in the light loss preventing layer so as to increase an extraction efficiency of the light generated from the organic layer through the substrate layer.

49. The organic EL device according to claim 47, wherein the light loss preventing layer decreases loss and reflectivity of the light irradiated from the organic layer.

50. The organic EL device according to claim 4, wherein the light loss preventing layer has a thickness in the range of 0.01 to 50 μm.

* * * * *